(12) United States Patent
Chen et al.

(10) Patent No.: US 7,994,864 B2
(45) Date of Patent: Aug. 9, 2011

(54) AUDIO OUT UNIT

(75) Inventors: Hung-I Chen, Kaohsiung (TW); Yen-Hsun Hsu, Hengshan Township, Hsinchu County (TW); Sung-Han Wen, Taipei (TW); Wei-Cheng Tang, Zhubei (TW)

(73) Assignee: Mediatek Inc., Hsin-Chu (TW)

( * ) Notice: Subject to any disclaimer, the term of this patent is extended or adjusted under 35 U.S.C. 154(b) by 0 days.

(21) Appl. No.: 12/637,102

(22) Filed: Dec. 14, 2009

(65) Prior Publication Data

US 2010/0148867 A1 Jun. 17, 2010

Related U.S. Application Data

(60) Provisional application No. 61/196,730, filed on Dec. 15, 2008.

(51) Int. Cl.
*H03F 3/04* (2006.01)

(52) U.S. Cl. ....................................................... 330/297
(58) Field of Classification Search .................. 330/199, 330/297; 327/536, 537, 540
See application file for complete search history.

(56) References Cited

U.S. PATENT DOCUMENTS

| | | | |
|---|---|---|---|
| 5,289,137 A | | 2/1994 | Nodar et al. |
| 5,450,037 A | * | 9/1995 | Kanaya et al. ................. 330/297 |
| 6,825,726 B2 | * | 11/2004 | French et al. .................. 330/297 |
| 7,061,327 B2 | | 6/2006 | Doy |
| 7,061,328 B2 | | 6/2006 | Doy |
| 7,183,857 B2 | | 2/2007 | Doy et al. |
| 7,382,195 B2 | * | 6/2008 | Chen et al. ..................... 330/297 |
| 2009/0302950 A1 | * | 12/2009 | Pujol .............................. 330/297 |

* cited by examiner

*Primary Examiner* — Khanh V Nguyen
(74) *Attorney, Agent, or Firm* — Thomas|Kayden

(57) ABSTRACT

A DC-coupled audio out unit is provided, including at least one regulator and at least one audio amplifier. The regulator is coupled to at least one power terminal of the audio amplifier.

17 Claims, 19 Drawing Sheets

US 7,994,864 B2

AUDIO OUT UNIT

CROSS REFERENCE TO RELATED APPLICATIONS

This application claims the benefit of U.S. Provisional Application No. 61/196,730, filed Dec. 15, 2008, the entirety of which is incorporated by reference herein.

BACKGROUND OF THE INVENTION

1. Field of the Invention

The invention relates to an audio out unit, and in particular relates to a DC-coupled audio out unit with regulators at power terminals of audio amplifiers.

2. Description of the Related Art

FIG. 1 shows an audio out unit 100 with a headphone jack 50. The audio out unit 100 comprises a right audio amplifier 101 and a left audio amplifier 102 which respectively receives and amplifies audio signals to respectively generate a right audio signal and a left audio signal. The headphone jack 50 comprises a first node $N_1$ to receive the right audio signal from the right audio amplifier 101 and a second node $N_2$ to receive the left audio signal from the left audio amplifier 102 and a third node $N_3$ to connect to a ground. Users can plug an earphone jack (not shown in FIG. 1) into the headphone jack 50 to receive the left and right audio signals, which are stereo audio signals.

BRIEF SUMMARY OF THE INVENTION

A detailed description is given in the following embodiments with reference to the accompanying drawings.

An embodiment of a DC-coupled audio out unit is provided. The DC-coupled audio out unit comprises a first regulator, a second regulator, and at least one audio amplifier. The first regulator receives a power source voltage to provide a positive power voltage. The second regulator receives the power source voltage to provide a negative power voltage. The audio amplifier receives the positive power voltage and the negative power voltage and amplifies at least one input signal to generate an audio output signal to an audio load.

Another embodiment of a DC-coupled audio out unit is provided. The DC-coupled audio out unit comprises a first regulator, a third regulator, a second regulator and at least one audio amplifier. The first regulator receives a power source voltage to provide a positive power voltage. The third regulator receives the power source voltage to provide an intermediate voltage. The second regulator receives the intermediate voltage to provide a negative power voltage. The audio amplifier receives the positive power voltage and the negative power voltage and amplifies at least one input signal to generate an audio output signal to an audio load.

Another embodiment of a DC-coupled audio out unit is provided. The DC-coupled audio out unit comprises a regulator and at least one audio amplifier. The regulator receives a first power source voltage to provide a negative power voltage. The audio amplifier receives a second power source voltage and the negative power voltage, and amplifies at least one input signal to generate an audio output signal to an audio load.

Another embodiment of a DC-coupled audio out unit is provided. The DC-coupled audio out unit comprises a first regulator, a voltage drive circuit, a second regulator and at least one audio amplifier. The first regulator receives a first supplied voltage to provide a control voltage. The voltage drive circuit is supplied by a power source voltage, and is arranged to generate a positive power voltage according to the control voltage. The second regulator receives an intermediate voltage to provide a negative power voltage. The audio amplifier receives the positive power voltage and the negative power voltage, and amplifies at least one input signal to generate an audio output signal to an audio load.

Another embodiment of a DC-coupled audio out unit is provided. The DC-coupled audio out unit comprises a first regulator, a first voltage drive circuit, a second regulator, a second voltage drive circuit, and at least one audio amplifier. The first regulator receives a first supplied voltage to provide a first control voltage. The first voltage drive circuit is supplied by a power source voltage and is arranged to generate a positive power voltage according to the first control voltage. The second regulator receives an second supplied voltage to provide a second control voltage. The second voltage drive circuit is supplied by a third supplied voltage and is arranged to generate a negative power voltage according to the second control voltage. The audio amplifier receives the positive power voltage and the negative power voltage, and amplifies at least one input signal to generate an audio output signal to an audio load.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
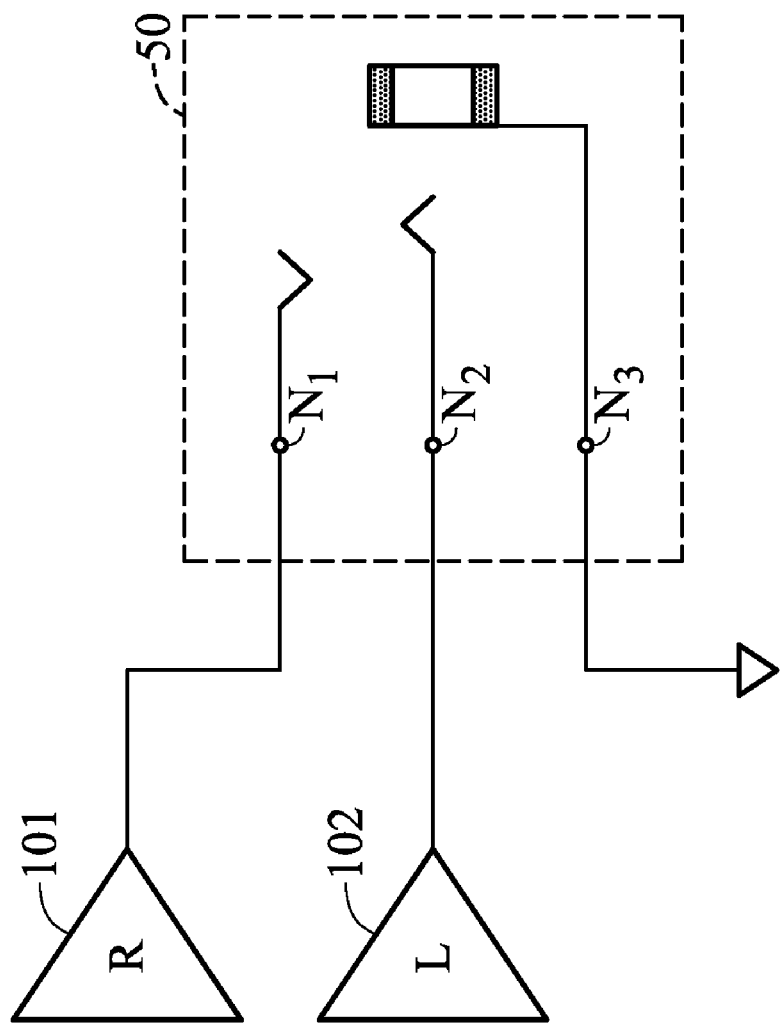
FIG. 1 shows an audio out unit with a headphone jack.
Figure 2:
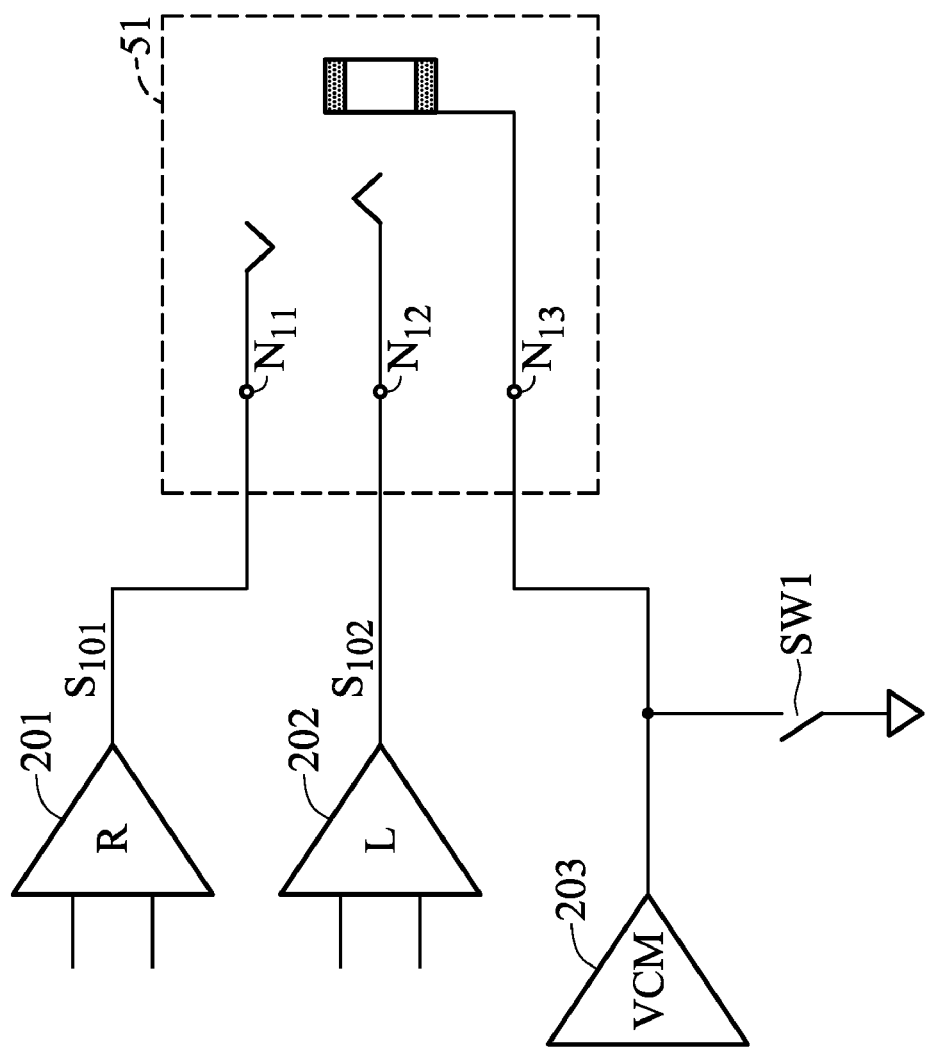
FIG. 2 shows an audio out unit with a headphone jack according to an embodiment of the invention.

FIG. 2 shows an audio out unit 200 with a headphone jack 51 according to an embodiment of the invention. The audio out unit 200 comprises a right audio amplifier 201 and a left audio amplifier 202 which respectively receives and amplifies audio signals to generate a right audio signal $S_{101}$ and a left audio signal $S_{102}$. The headphone jack 51 comprises a first node $N_{11}$ to receive the right audio signal $S_{101}$ from the right audio amplifier 201 and a second node $N_{12}$ to receive the left audio signal $S_{102}$ from the left audio amplifier 202 and a third node $N_{13}$. The third node $N_{13}$ connects to a VCM buffer 203 (reference voltage unit) to receive a common-mode voltage or connects through a switch Sw1 to a ground to receive a ground voltage. Thus, the third node $N_{13}$ is at the common mode voltage level or the ground voltage level controlled by the switch Sw1. For example, if the right audio signal $S_{101}$ and the left audio signal $S_{102}$ comprises a DC common mode voltage 0V, the switch Sw1 is turned on so that the node N13 connects to the ground and the third node $N_{13}$ is at 0V. If both of the right audio signal $S_{101}$ and the left audio signal $S_{102}$ comprise a DC common mode voltage 1.5V, the switch Sw1 is turned off and the VCM buffer 203 provides a DC common mode voltage 1.5V.

Figure 3A:
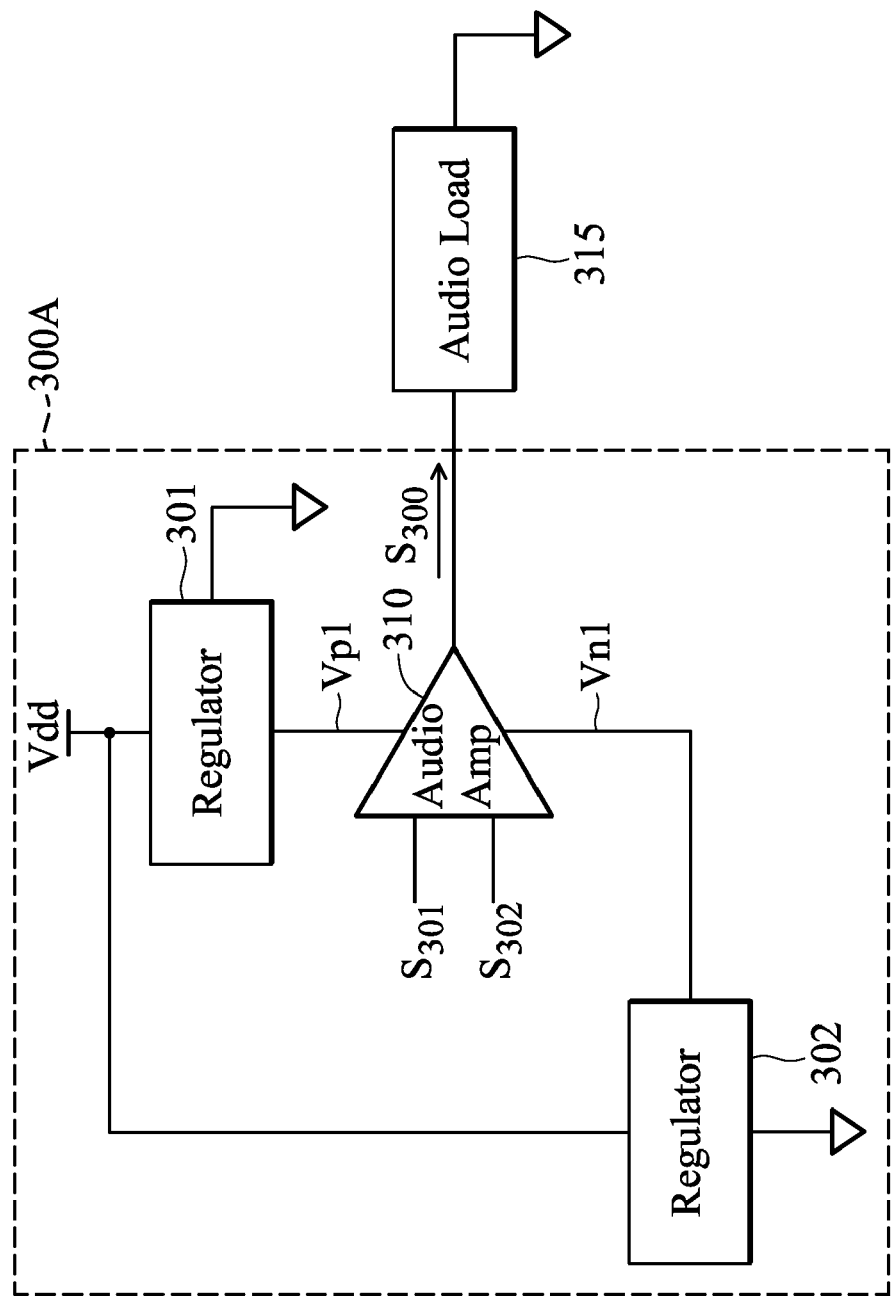
FIG. 3A shows a DC-coupled audio out unit 300A according to another embodiment of the invention.

FIG. 3A shows a DC-coupled audio out unit 300A according to another embodiment of the invention. The DC-coupled audio out unit 300A comprises a first regulator 301, a second regulator 302 and an audio amplifier 310. A power source voltage Vdd is generated by an outside voltage supplier or equipment (not shown in FIG. 3A) and may be polluted by other power sources and coupled some interference signals. The first regulator 301 is coupled to the power source voltage Vdd and may be a linear regulator, such as a low-dropout regulator (LDO), reducing noise and ripples to generate a clean DC positive power voltage Vp1 for the audio amplifier 310. The second regulator 302 can be a switching regulator, such as either a charge pump circuit or an inductor based regulator, or a linear regulator, such as a low-dropout regulator (LDO). The second regulator 302 is also coupled to the power source voltage Vdd and reduces noise and ripples to generate a clean DC negative power voltage Vn1 for the audio amplifier 310. The audio amplifier 310 receives the positive power voltage Vp1 and the negative power voltage Vn1 and amplifies input signals $S_{301}$ and $S_{302}$ to generate an audio output signal $S_{300}$ to an audio load 315.

As an example, assuming that the DC power source voltage Vdd is at 3.3V, the DC positive power voltage Vp1 provided by the regulator is at 2.8V and the DC negative power voltage Vn1 provided by the regulator 302 is at −1.4V. Absolute values of the positive power voltage Vp1 and the negative power voltage Vn1 can be different. Note that the audio output signal $S_{300}$ comprises a common-mode DC voltage 0V and a differential-mode AC voltage swinging between +1.2V to −1.2V. Since the common-mode DC voltage of the audio output signal S300 is at 0V, no DC-blocking capacitor is required to be between the amplifier 310 and the audio load 315 for blocking DC voltage.

Figure 3B:
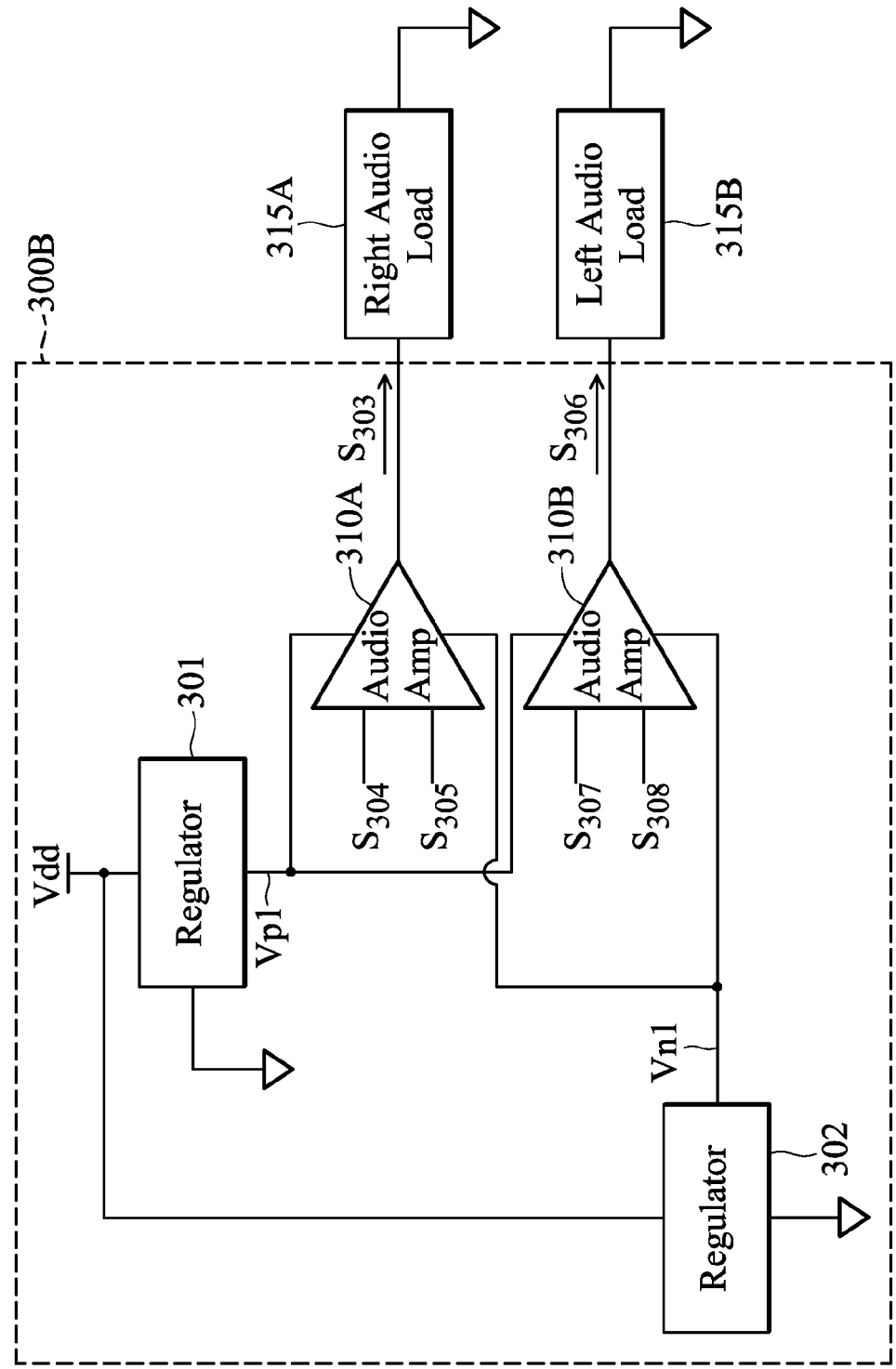
FIG. 3B shows a DC-coupled audio out unit 300B in a stereo system according to an embodiment of the invention.

FIG. 3B shows a DC-coupled audio out unit 300B in a stereo system according to an embodiment of the invention. Note that the elements labeled with the same numbers in FIG. 3A perform the same function. Unlike FIG. 3A, the right audio amplifier 310A receives the positive power voltage Vp1 and the negative power voltage Vn1 and amplifies input signals $S_{304}$ and $S_{305}$ for the right channel to generate a right audio output signal $S_{303}$ to a right audio load 315A, and the left audio amplifier 310B receives the positive power voltage Vp1 and the negative power voltage Vn1 and amplifies input signals $S_{307}$ and $S_{308}$ for the left channel to generate a left audio output signal $S_{306}$ to a left audio load 315B.

Figure 4A:
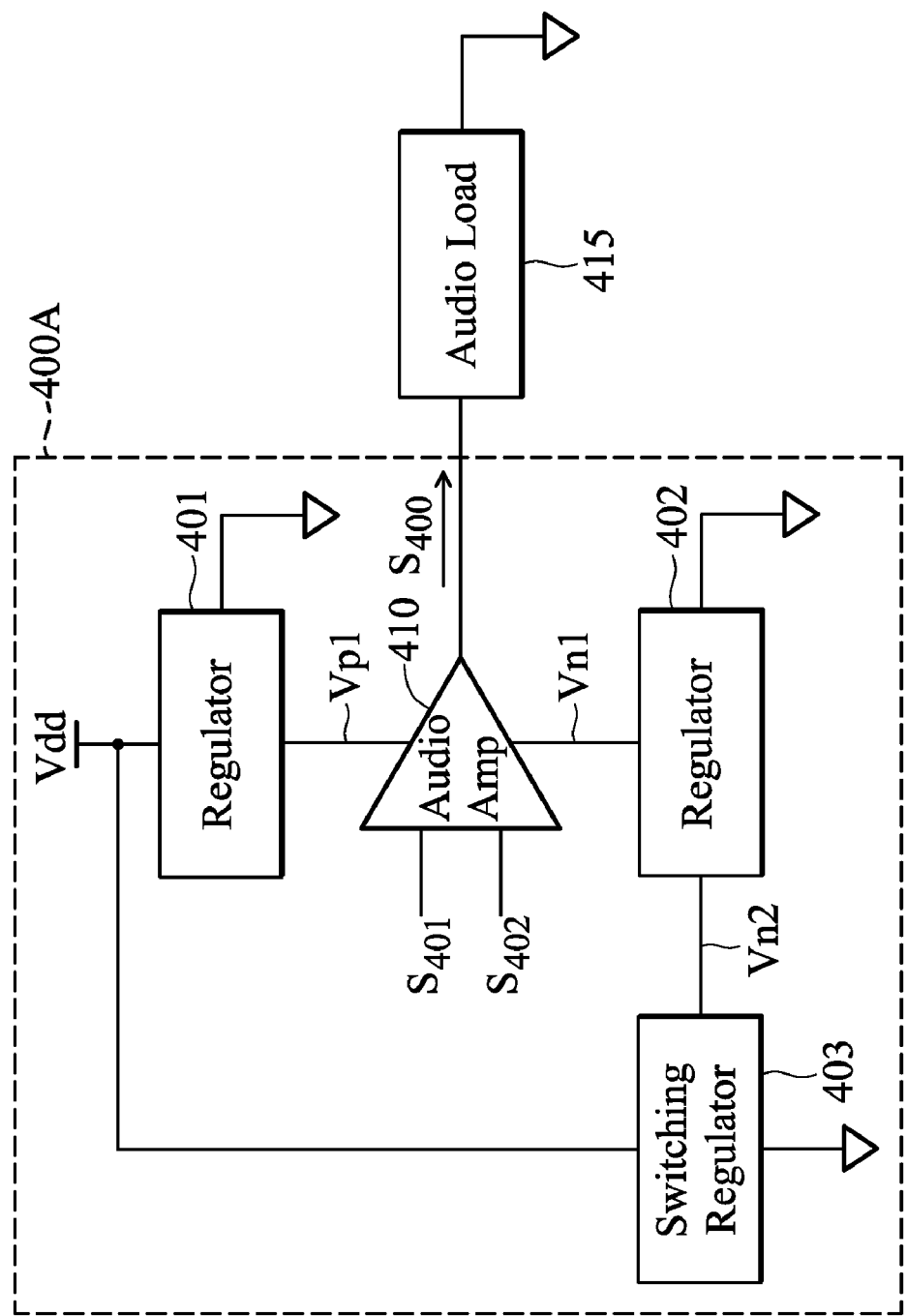
FIG. 4A shows a DC-coupled audio out unit 400A according to another embodiment of the invention.

FIG. 4A shows a DC-coupled audio out unit 400A according to another embodiment of the invention. The DC-coupled audio out unit 400A comprises a first regulator 401, a second regulator 402, a third regulator 403 and an audio amplifier 410. The first regulator 401 is coupled to the power source voltage Vdd and may be a linear regulator, such as an LDO, reducing noise and ripples to generate a clean DC positive power voltage Vp1 for the audio amplifier 410. The third regulator 403 may be a switching regulator, such as either a charge pump circuit or an inductor based regulator, generating a DC negative power voltage Vn2 to the second regulator 402. The second regulator 402 may be a linear regulator, such as an LDO, reducing noise and ripples to generate a clean DC negative power voltage Vn1 for the audio amplifier 410. The audio amplifier 410 receives the positive power voltage Vp1 and the negative power voltage Vn1 and amplifies input signals $S_{401}$ and $S_{402}$ to generate an audio output signal $S_{400}$ to an audio load 415.

Figure 4B:
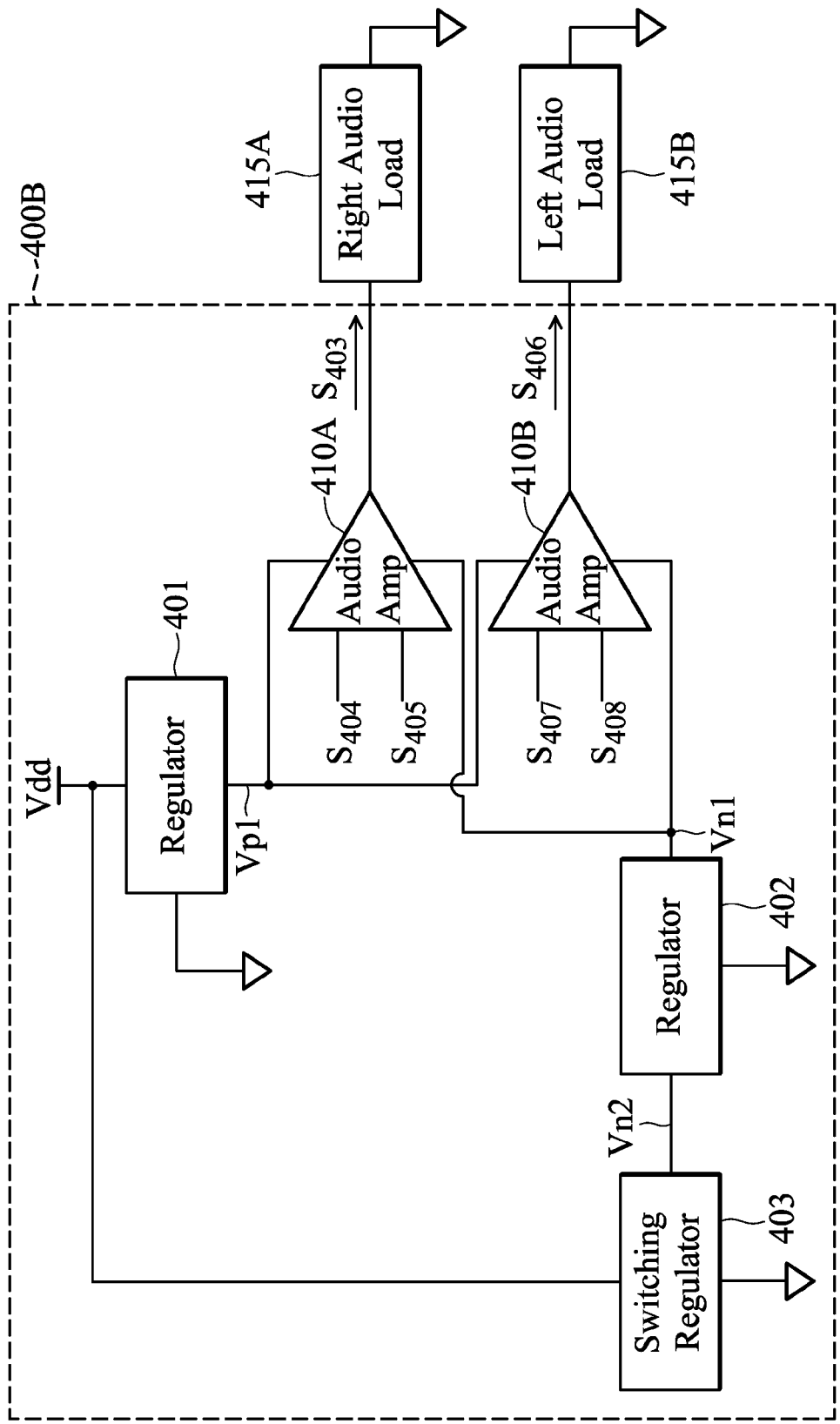
FIG. 4B shows a DC-coupled audio out unit 400B in a stereo system according to another embodiment of the invention.

FIG. 4B shows a DC-coupled audio out unit 400B in a stereo system according to another embodiment of the invention. Note that the elements labeled with the same numbers in FIG. 4A perform the same function. Unlike FIG. 4A, the right audio amplifier 410A receives the positive power voltage Vp1 and the negative power voltage Vn1 and amplifies input signals $S_{404}$ and $S_{405}$ for the right channel to generate a right audio output signal $S_{403}$ to a right audio load 415A, and the left audio amplifier 410B receives the positive power voltage Vp1 and the negative power voltage Vn1 and amplifies input signals $S_{407}$ and $S_{408}$ for the left channel to generate a left audio output signal $S_{406}$ to a left audio load 415B.

Figure 5A:
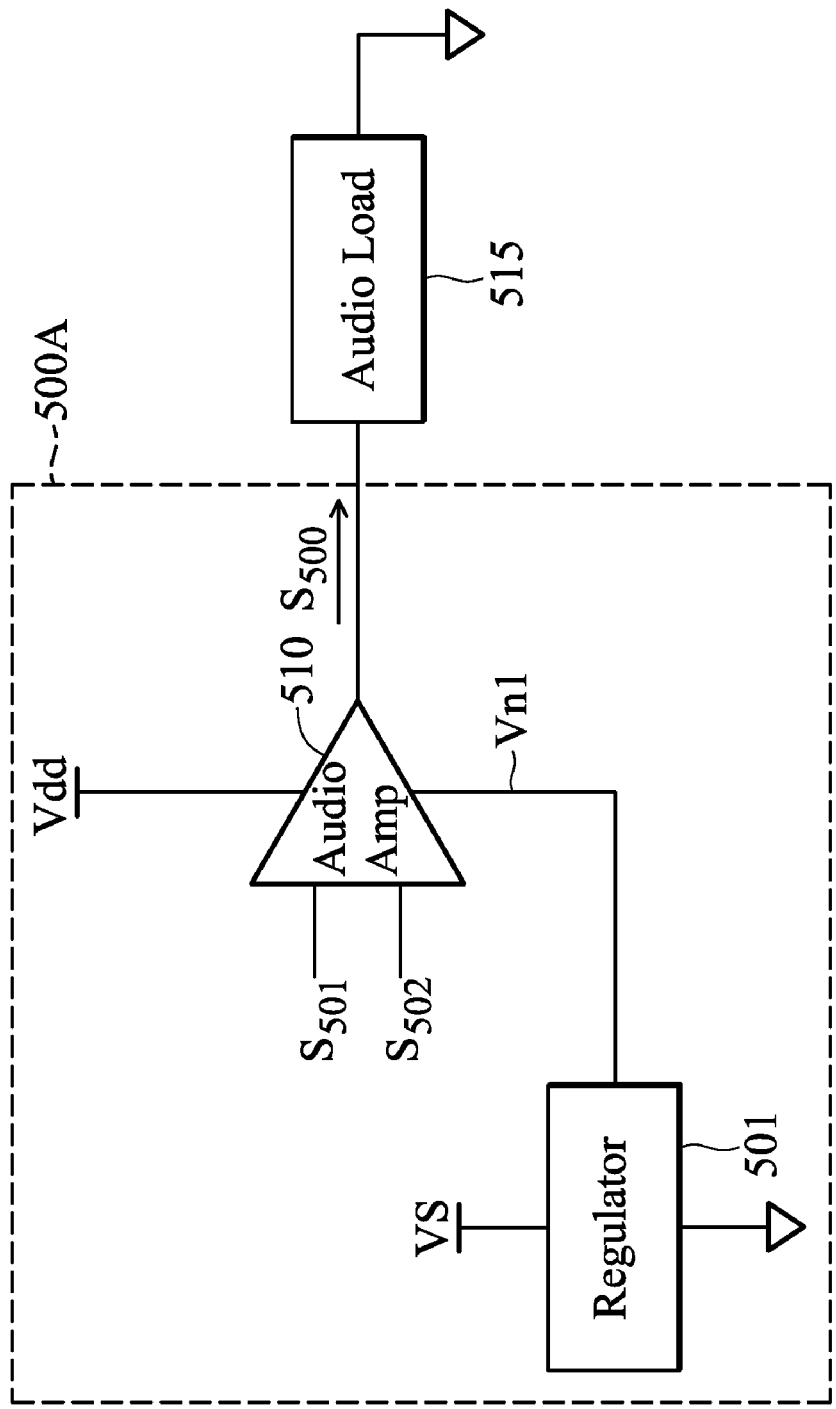
FIG. 5A shows a DC-coupled audio out unit 500A according to another embodiment of the invention.

FIG. 5A shows a DC-coupled audio out unit 500A according to another embodiment of the invention. The DC-coupled audio out unit 500A comprises a regulator 501 and an audio amplifier 510. The regulator 501 is coupled to a power source voltage VS and may be a linear regulator, such as an LDO, reducing noise and ripples to generate a clean DC negative power voltage Vn1 for the audio amplifier 510. When the regulator 501 is a linear regulator, the power source voltage VS is of a negative voltage level. In another embodiment, the regulator 501 may be a switching regulator, such as either a charge pump circuit or an inductor based regulator. When the regulator 501 is a switching regulator, the power source voltage VS may be realized by the voltage Vdd shown in FIG. 5A or another voltage level independent of the voltage Vdd. The audio amplifier 510 receives the positive power source voltage Vdd and the negative power voltage Vn1 and amplifies input signals $S_{501}$ and $S_{502}$ to generate an audio output signal $S_{500}$ to an audio load 515.

Figure 5B:
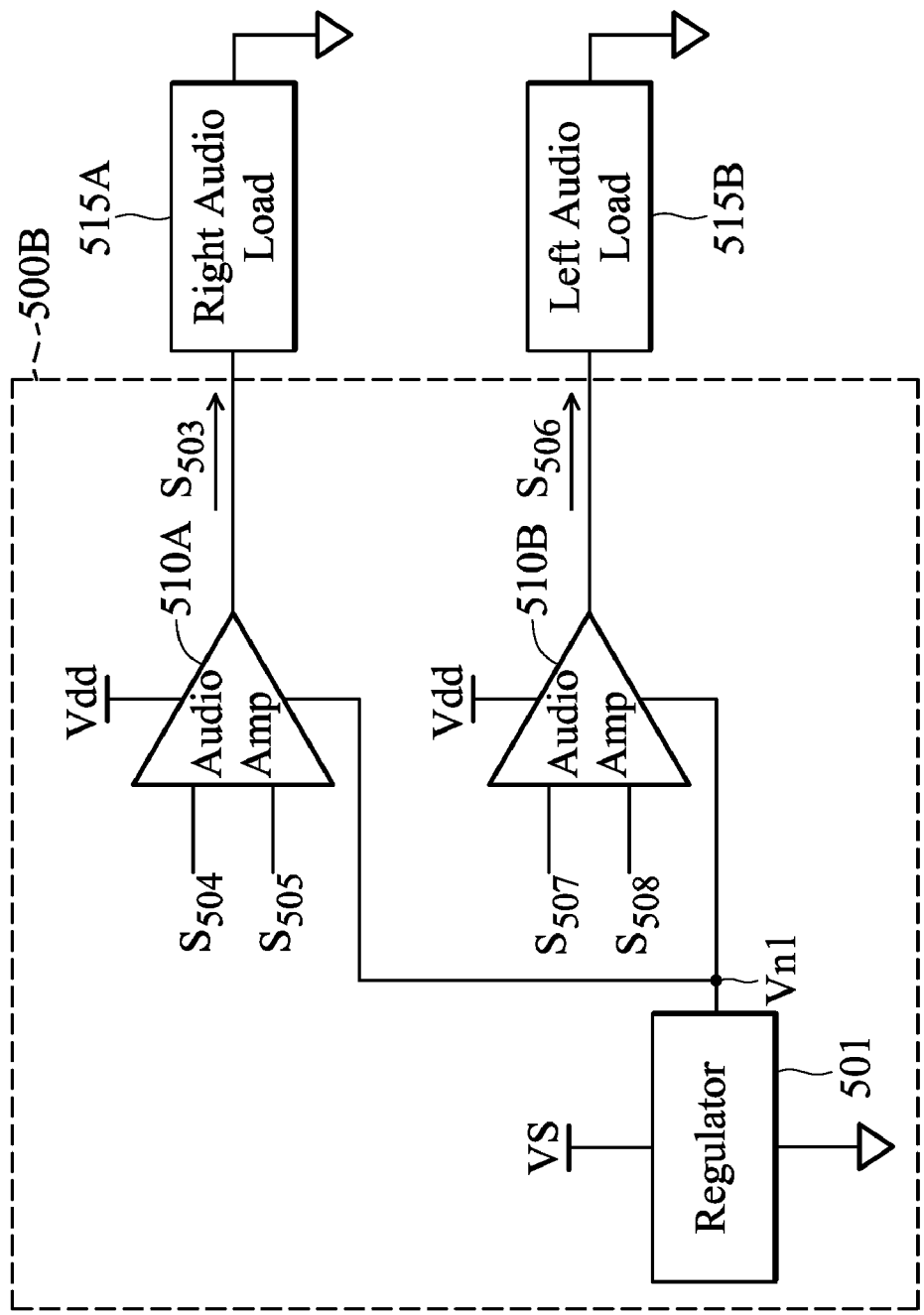
FIG. 5B shows a DC-coupled audio out unit 500B in a stereo system according to another embodiment of the invention.

FIG. 5B shows a DC-coupled audio out unit 500B in a stereo system according to another embodiment of the invention. Note that the elements labeled with the same numbers in FIG. 5A perform the same function. Unlike FIG. 5A, the right audio amplifier 510A receives the positive power source voltage Vdd and the negative power voltage Vn1 and amplifies input signals $S_{504}$ and $S_{505}$ for the right channel to generate a right audio output signal $S_{503}$ to a right audio load 515A, and the left audio amplifier 510B receives the positive power source voltage Vdd and the negative power voltage Vn1 and amplifies input signals $S_{507}$ and $S_{508}$ for the left channel to generate a left audio output signal $S_{506}$ to a left audio load 515B.

Figure 6A:
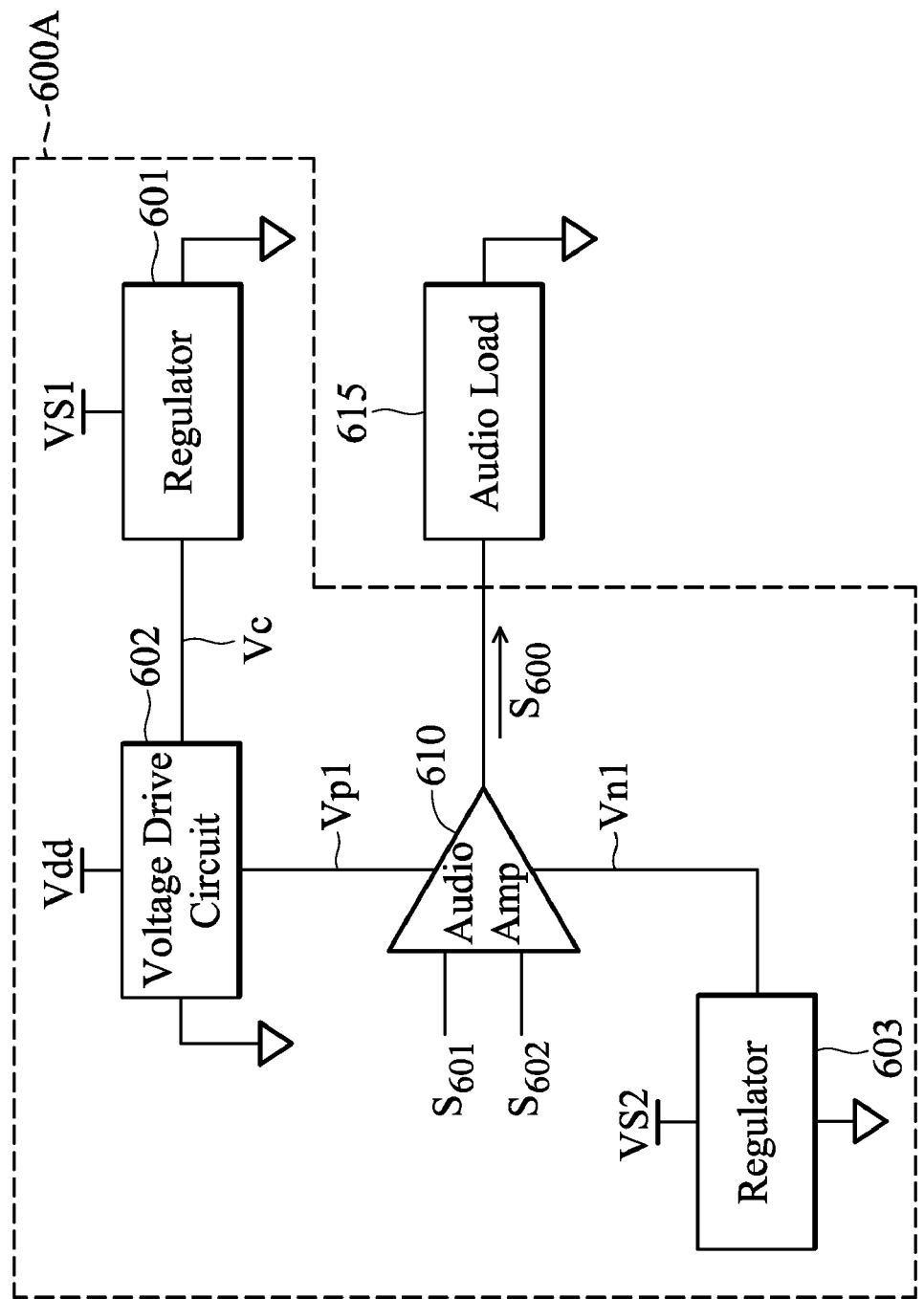
FIG. 6A shows a DC-coupled audio out unit 600A according to another embodiment of the invention.

FIG. 6A shows a DC-coupled audio out unit 600A according to another embodiment of the invention. The DC-coupled audio out unit 600A comprises a regulator 601, a voltage drive circuit 602, a regulator 603 and an audio amplifier 610. The regulator 601 receives a supplied voltage VS1 to provide a control voltage Vc. The voltage drive circuit 602 is supplied by a power source voltage Vdd and is arranged to generate a positive power voltage Vp1 according to the control voltage Vc. The regulator 602 receives a voltage VS2 to provide a negative power voltage Vn1. The audio amplifier 610 receives the positive power voltage Vp1 and the negative power voltage Vn1, and amplifies input signals $S_{601}$ and $S_{602}$ to generate an audio output signal $S_{600}$ to an audio load 615.

Figure 7:
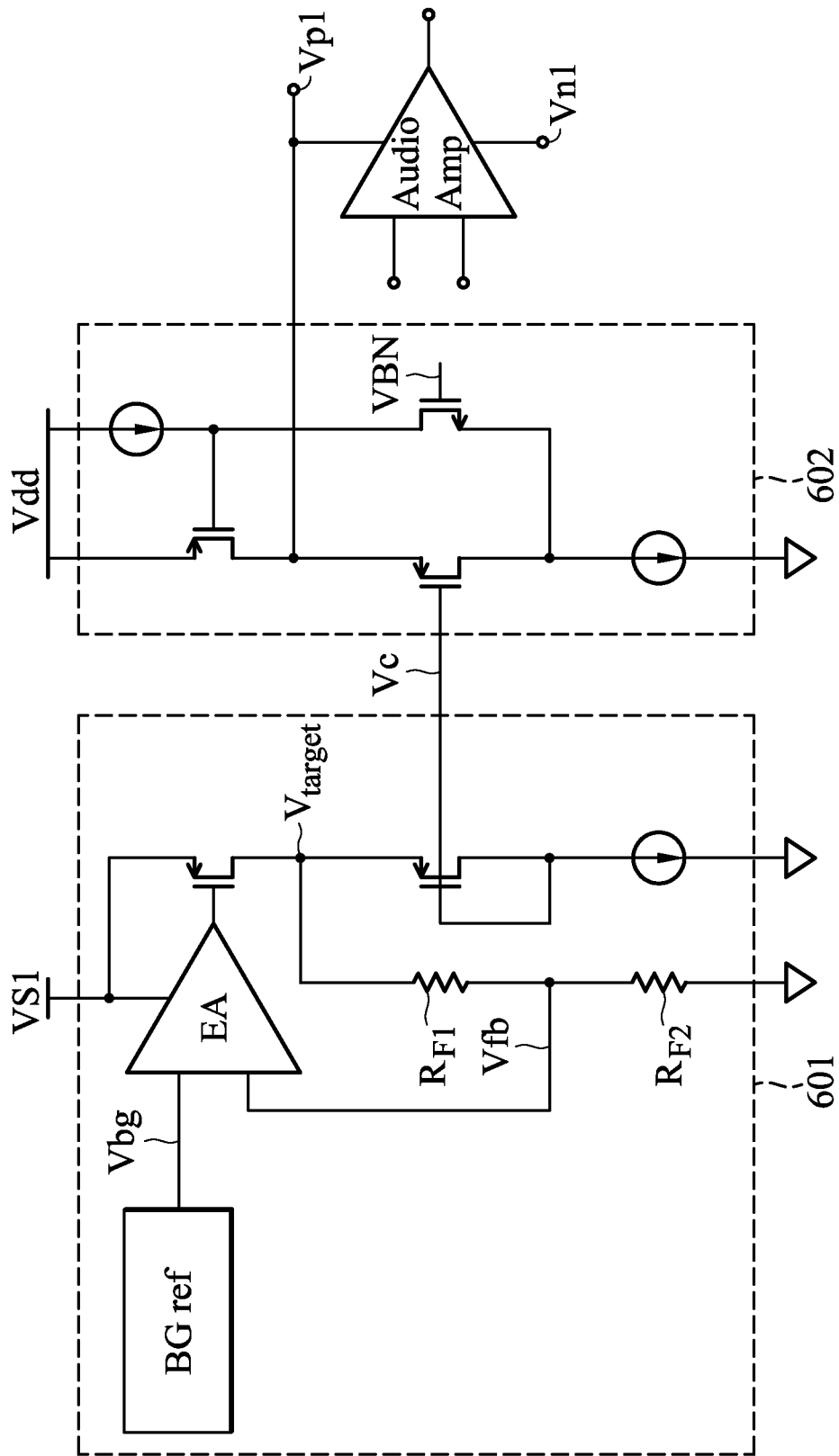
FIG. 7 shows an embodiment of the regulator 601 and the voltage drive circuit 602.

FIG. 7 shows an embodiment of the regulator 601 and the voltage drive circuit 602. The regulator 601 may be a linear regulator, such as an LDO, reducing noise and ripples of the supplied voltage VS1 to guarantee that the control voltage Vc is clean. The voltage drive circuit 602 coupled between the regulator 601 and the power terminal of the audio amplifier blocks the regulator 601 from voltage vibrations, caused by huge current drawn by the audio amplifier, at the power terminal of the audio amplifier. The voltage drive circuit 602 allows the regulator 601 to be realized by low cost regulators. The supplied voltage VS1 may be realized by the power source voltage Vdd that powers the voltage drive circuit 602, or may be realized by another voltage level independent of the power source voltage Vdd.

Referring back to FIG. 6A, the regulator 603 is powered by a voltage VS2. In the embodiments when the regulator 603 is a linear regulator, such as an LDO, and the voltage VS2 is of a negative voltage level, the regulator 603 reduces noise and ripples of the negative voltage level VS2 to generate the negative power voltage Vn1. In another embodiment when the regulator 603 is a switching regulator, such as either a charge pump circuit or an inductor based regulator, the voltage VS2 may be realized by the power source voltage Vdd that powers the voltage drive circuit 602, or may be realized by the supplied voltage VS1 that powers the regulator 601, or may be designed to be another voltage level independent of the supplied voltage VS1 and the power source voltage Vdd.

Figure 6B:
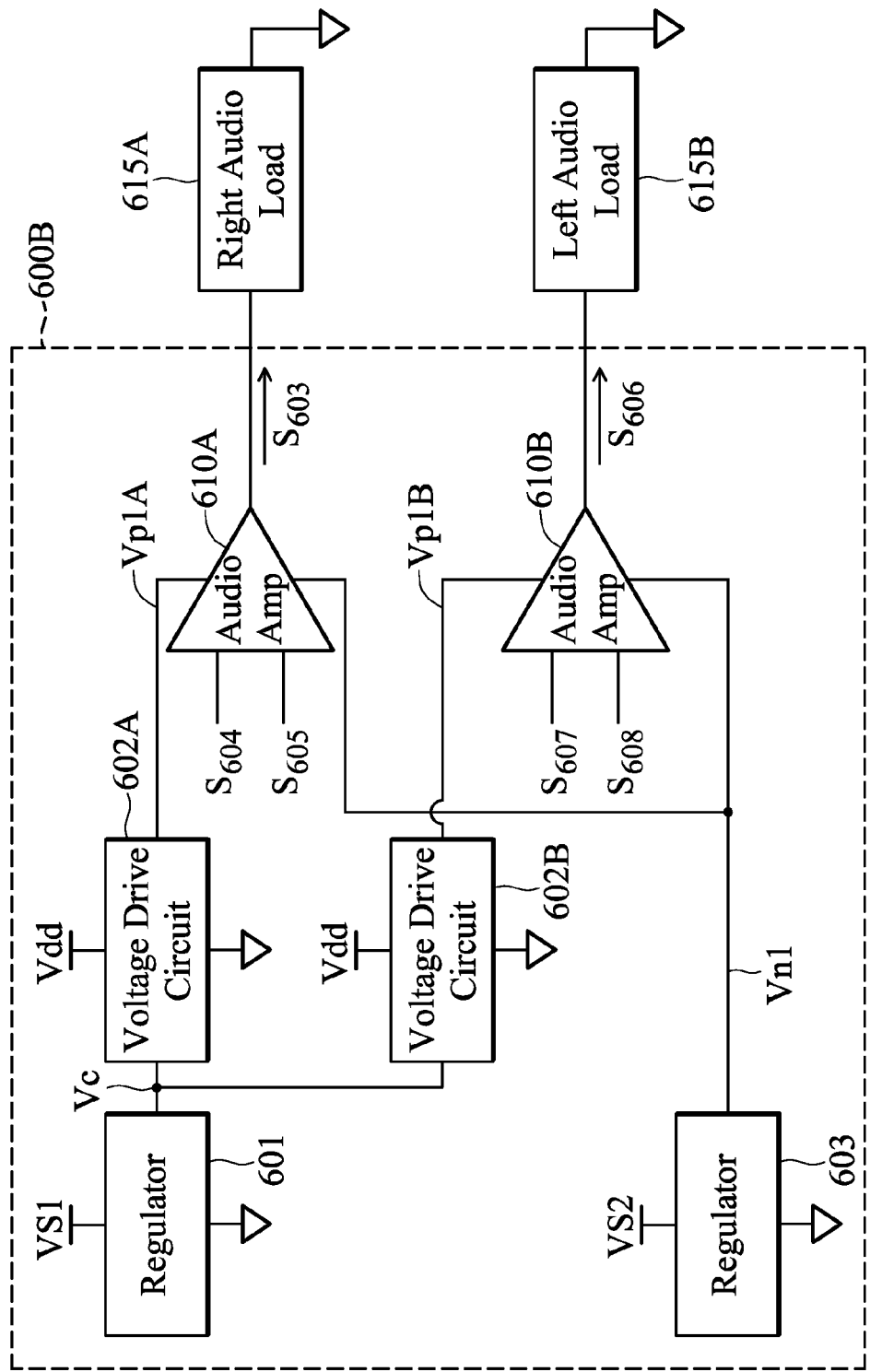
FIG. 6B shows a DC-coupled audio out unit 600B in a stereo system according to an embodiment of the invention.

FIG. 6B shows a DC-coupled audio out unit 600B in a stereo system according to another embodiment of the invention. Note that the elements labeled with the same numbers in FIG. 6A perform the same function. Because the regulator 601 is blocked from the huge current drawn by the audio amplifier 610A or 610B, the right and left audio amplifiers 610A and 610B may share the regulator 601 and the two voltage drive circuits 602A and 602B are separately designed for the right and left audio. According to the control voltage Vc, the voltage drive circuits 602A and 602B generate positive power voltages Vp1A and Vp1B, respectively, for the right and left audio amplifiers 610A and 610B. The sharing of the first regulator 601 reduces considerable circuit size of the audio out unit 600B. The right audio amplifier 610A receives the positive power voltage Vp1A and the negative power voltage Vn1 and amplifies input signals $S_{604}$ and $S_{605}$ for the right channel to generate a right audio output signal $S_{603}$ to a right audio load 615A, and the left audio amplifier 610B receives the positive power voltage Vp1B and the negative power voltage Vn1 and amplifies input signals $S_{607}$ and $S_{608}$ for the left channel to generate a left audio output signal $S_{606}$ to a left audio load 615B.

Figure 8A:
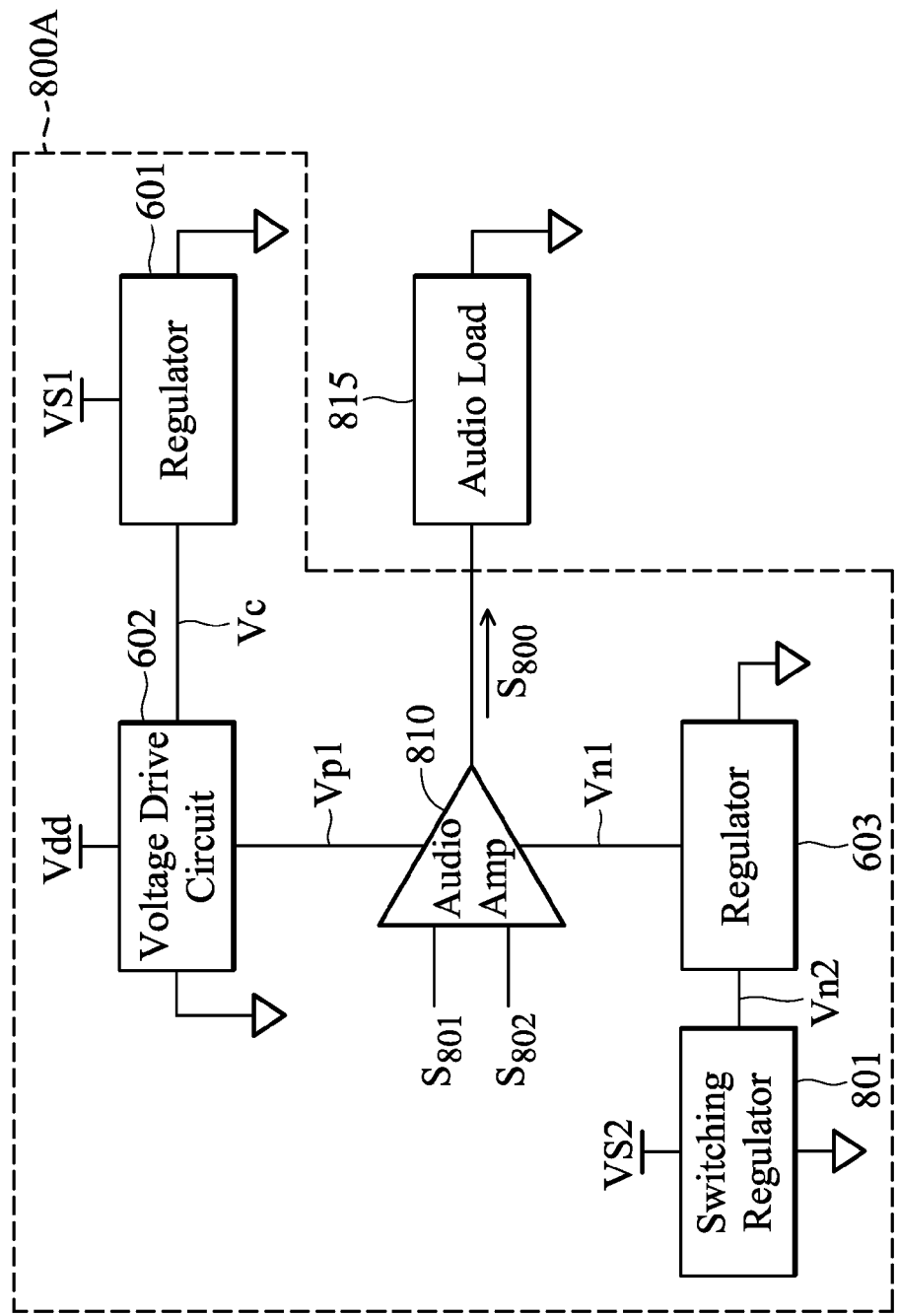
FIG. 8A shows a DC-coupled audio out unit 800A according to another embodiment of the invention.

FIG. 8A shows a DC-coupled audio out unit 800A according to another embodiment of the invention. Compared with the embodiment shown in FIG. 6A, FIG. 8A further comprises a switching regulator 801, such as either a charge pump circuit or an inductor based regulator. The switching regulator 801 is powered by a voltage VS2 to generate an intermediate voltage Vn2 to power the regulator 603. In this case, the voltage VS2 may be realized by the power source voltage Vdd that powers the voltage drive circuit 602, or may be realized by the supplied voltage VS1 that powers the regulator 601, or another voltage level independent of the supplied voltage VS1 and the power source voltage Vdd. Furthermore, the regulator 603 may be a linear regulator, such as an LDO, reducing noise and ripples of the intermediate voltage Vn2 to generate a cleans negative power voltage Vn1. The audio amplifier 810 receives the positive power voltage Vp1 and the negative power voltage Vn1, and amplifies input signals $S_{801}$ and $S_{802}$ to generate an audio output signal $S_{800}$ to an audio load 815.

Figure 8B:
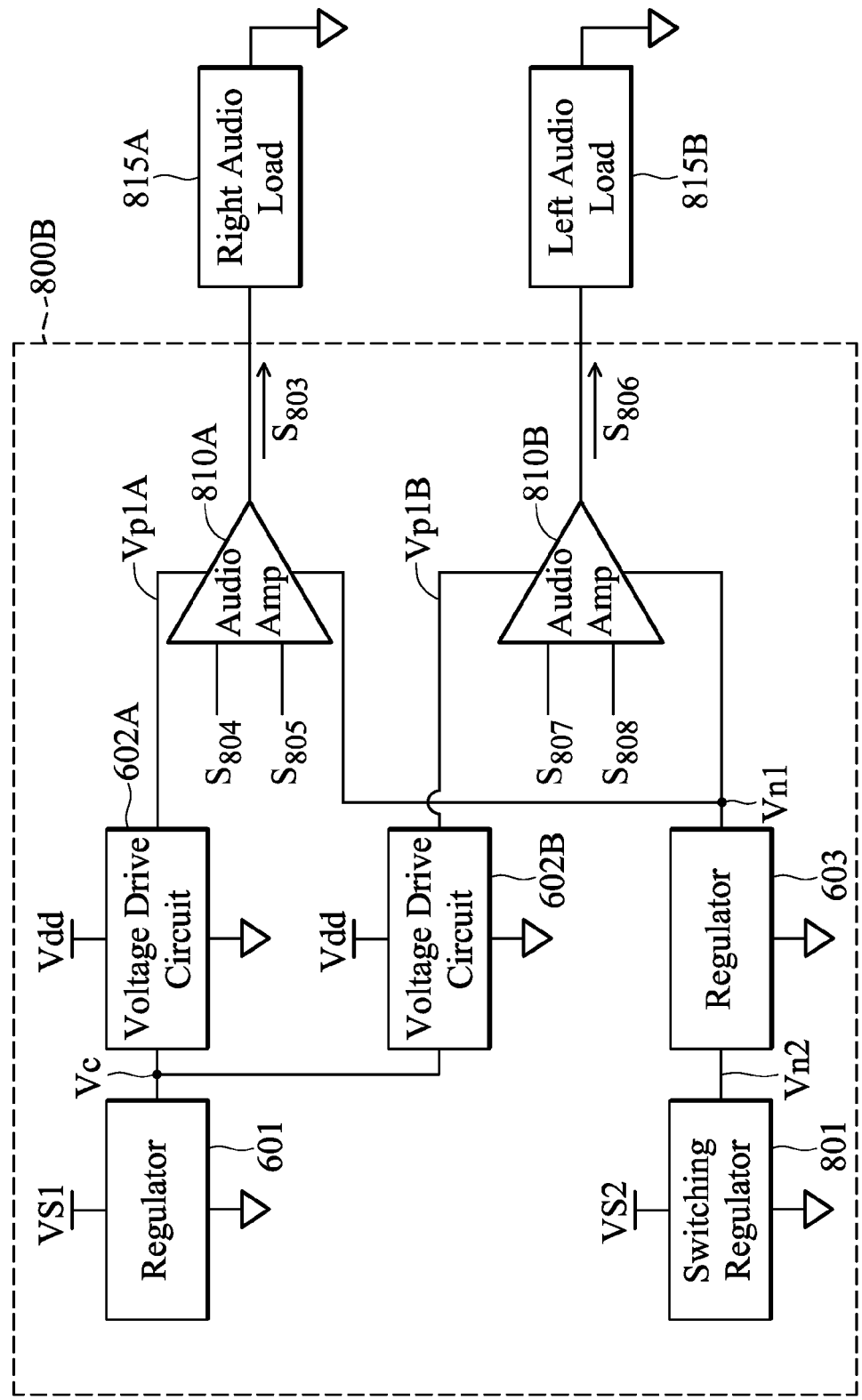
FIG. 8B shows a DC-coupled audio out unit 800B in a stereo system according to an embodiment of the invention.

FIG. 8B shows a DC-coupled audio out unit 800B in a stereo system according to another embodiment of the invention. Note that the elements labeled with the same numbers in FIG. 8A perform the same function. Unlike FIG. 8A, the right audio amplifier 810A receives the positive power voltage Vp1A and the negative power voltage Vn1 and amplifies input signals $S_{804}$ and $S_{805}$ for the right channel to generate a right audio output signal $S_{803}$ to a right audio load 815A, and the left audio amplifier 810B receives the positive power voltage Vp1B and the negative power voltage Vn1 and amplifies input signals $S_{807}$ and $S_{808}$ for the left channel to generate a left audio output signal $S_{806}$ to a left audio load 815B.

Figure 9A:
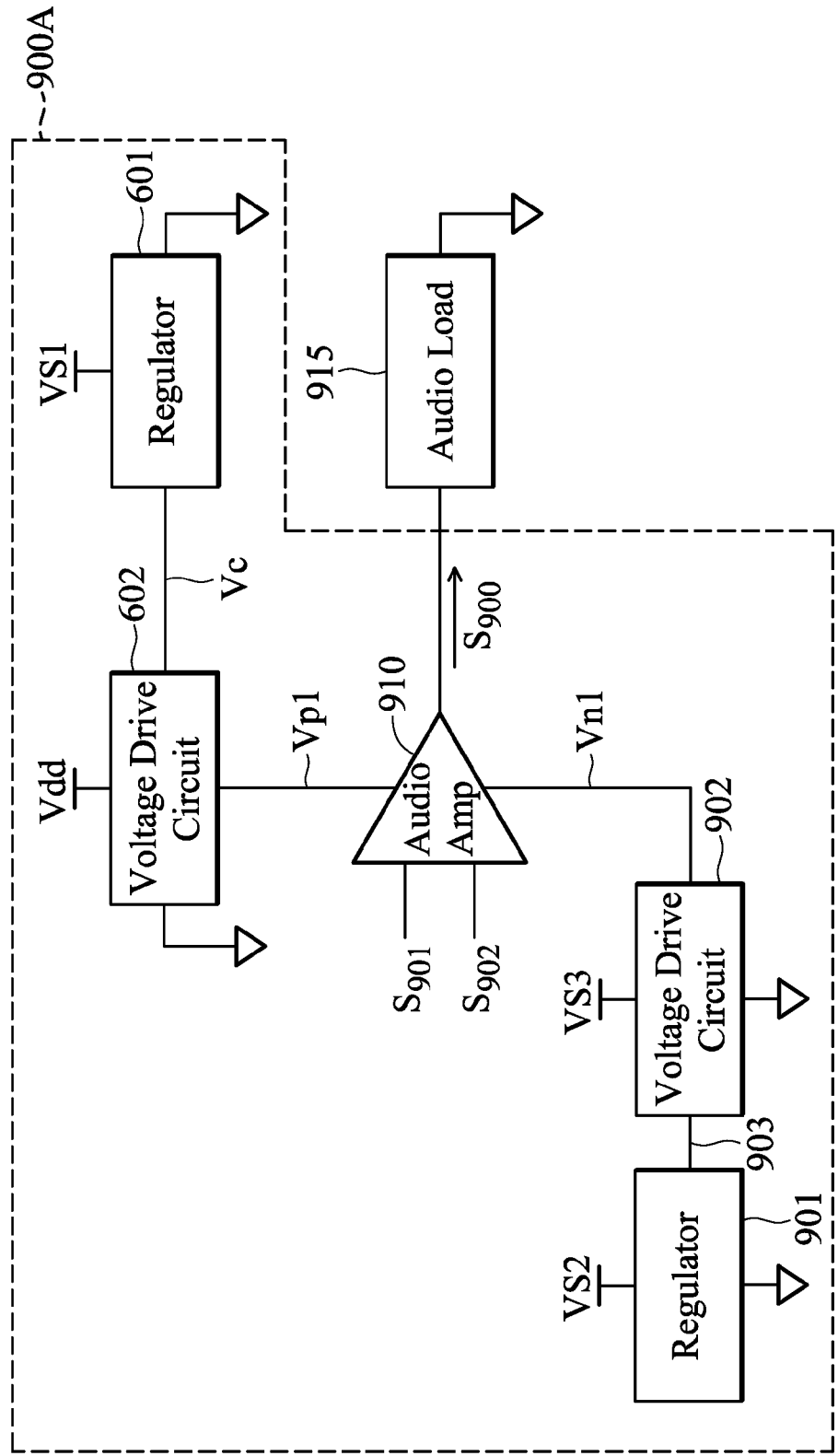
FIG. 9A shows a DC-coupled audio out unit 900A according to another embodiment of the invention.

FIG. 9A shows a DC-coupled audio out unit 900A according to another embodiment of the invention. Compared with the embodiment shown in FIG. 6A, the DC-coupled audio out unit 900A uses a regulator 901 and a voltage drive circuit 902 to generate the negative power voltage Vn1 for the negative power terminal of the audio amplifier 910. The regulator 901 is powered by a voltage VS2 to generate a control voltage 903. The voltage drive circuit 902 is powered by a voltage VS3 to generate the negative power voltage Vn1 according to the control voltage 903. In an embodiment when the regulator 901 is a linear regulator, such as an LDO, the voltages VS2 and VS3 are negative, and may be of the same voltage level or of distinct voltage levels. In another embodiment when the regulator 901 is a switching regulator, such as either a charge pump circuit or an inductor based regulator, the voltage VS2 may be realized by the voltage VS1 that powers the regulator 601, or may be realized by the power source voltage Vdd that powers the voltage drive circuit 602, or may be another voltage independent of the voltages Vdd and VS1, and the voltage VS3 is a negative voltage. The audio amplifier 910 receives the positive power voltage Vp1 and the negative power voltage Vn1, and amplifies input signals $S_{901}$ and $S_{902}$ to generate an audio output signal $S_{900}$ to an audio load 915.

Figure 9B:
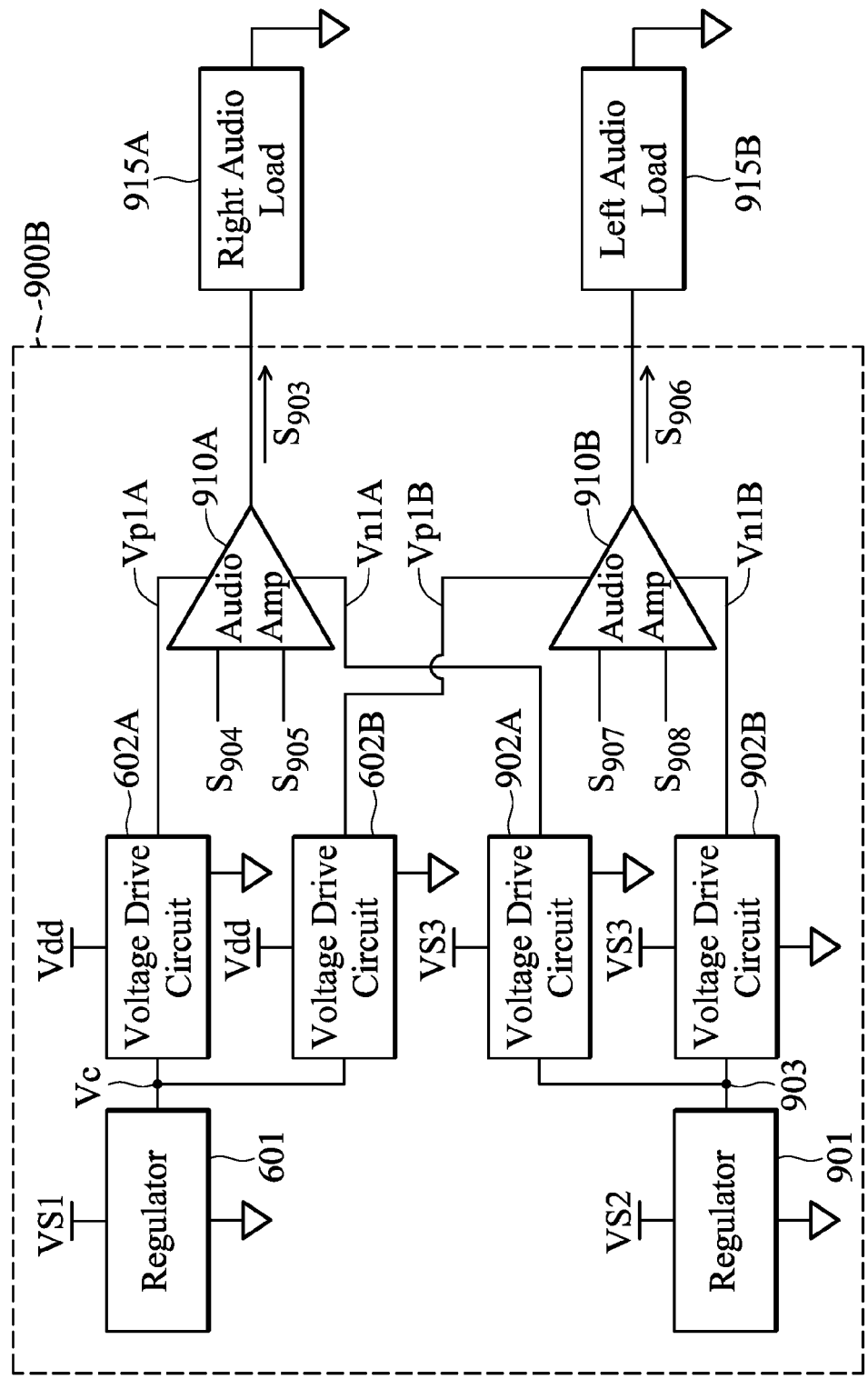
FIG. 9B shows a DC-coupled audio out unit 900B in a stereo system according to an embodiment of the invention.

FIG. 9B shows a DC-coupled audio out unit 900B in a stereo system according to another embodiment of the invention. Note that the elements labeled with the same numbers in FIG. 9A perform the same function. As shown, the right and left audio amplifiers 910A and 910B may share the regulator 901 and the two voltage drive circuits 902A and 902B are separately designed for the right and left audio. According to the control voltage 903, the voltage drive circuits 902A and 902B generate negative power voltages Vn1A and Vn1B, respectively, for the right and left audio amplifiers 910A and 910B. The sharing of the regulator 901 reduces considerable circuit size of the audio out unit 900B. The right audio amplifier 910A receives the positive power voltage Vp1A and the negative power voltage Vn1A and amplifies input signals $S_{904}$ and $S_{905}$ for the right channel to generate a right audio output signal $S_{903}$ to a right audio load 915A, and the left audio amplifier 910B receives the positive power voltage Vp1B and the negative power voltage Vn1B and amplifies input signals $S_{907}$ and $S_{908}$ for the left channel to generate a left audio output signal $S_{906}$ to a left audio load 915B.

Figure 10A:
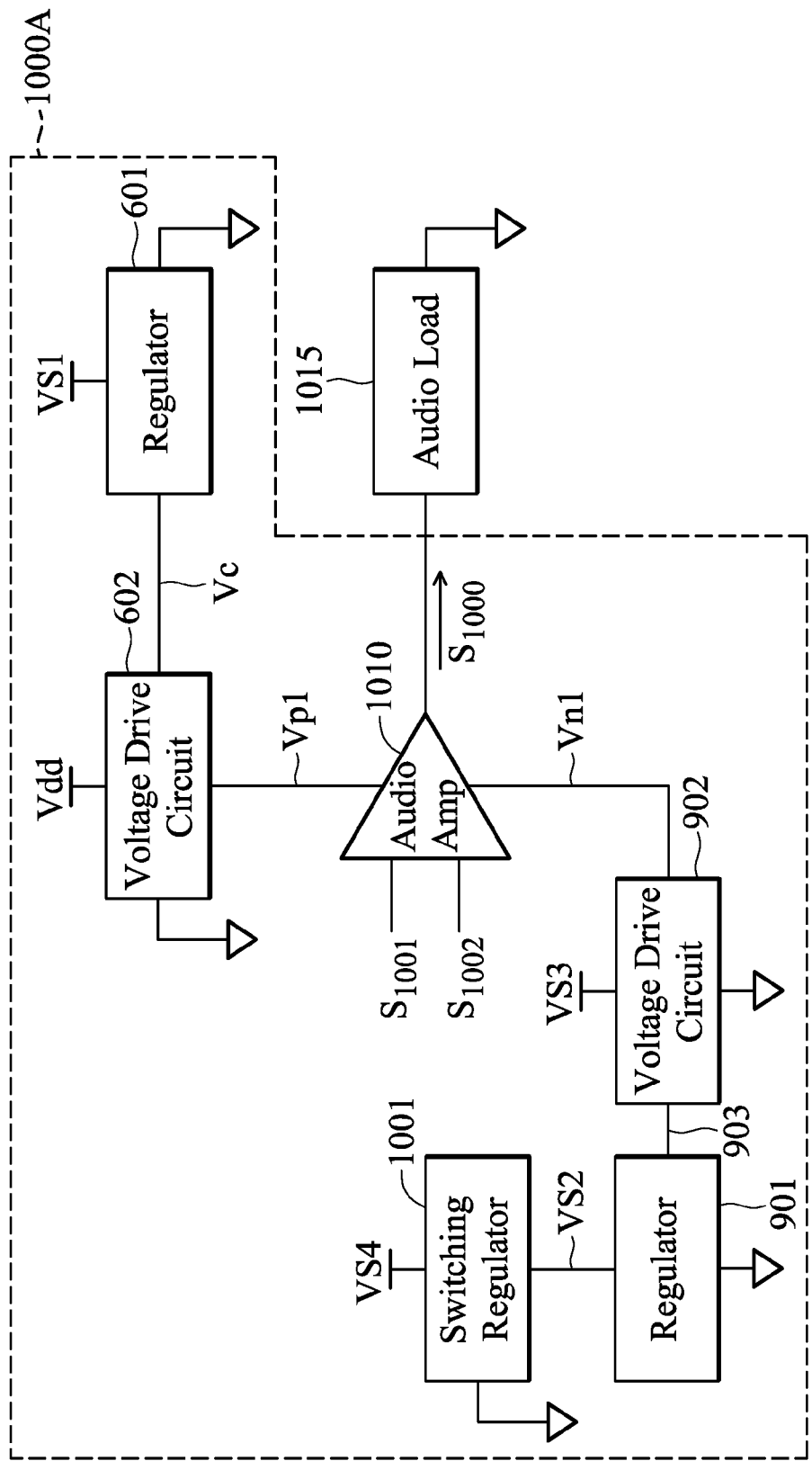
FIG. 10A shows a DC-coupled audio out unit 1000A according to another embodiment of the invention.

FIG. 10A shows a DC-coupled audio out unit 1000A according to another embodiment of the invention. Compared with the embodiment shown in FIG. 9A, the DC-coupled audio out unit 1000A further comprises a switching regulator 1001, such as either a charge pump circuit or an inductor based regulator. The switching regulator 1001 is powered by a voltage VS4 to generate a voltage VS2 to power the regulator 901. In this case, the voltage VS4 may be realized by the power source voltage Vdd that powers the voltage drive circuit 602, or the supplied voltage VS1 that powers the regulator 601, or another voltage level independent of the supplied voltage VS1 and the power source voltage Vdd, the regulator 901 may be a linear regulator, such as an LDO, and the voltage VS3 is negative. The audio amplifier 1010 receives the positive power voltage Vp1 and the negative power voltage Vn1, and amplifies input signals $S_{1001}$ and $S_{1002}$ to generate an audio output signal $S_{1000}$ to an audio load 1015.

Figure 10B:
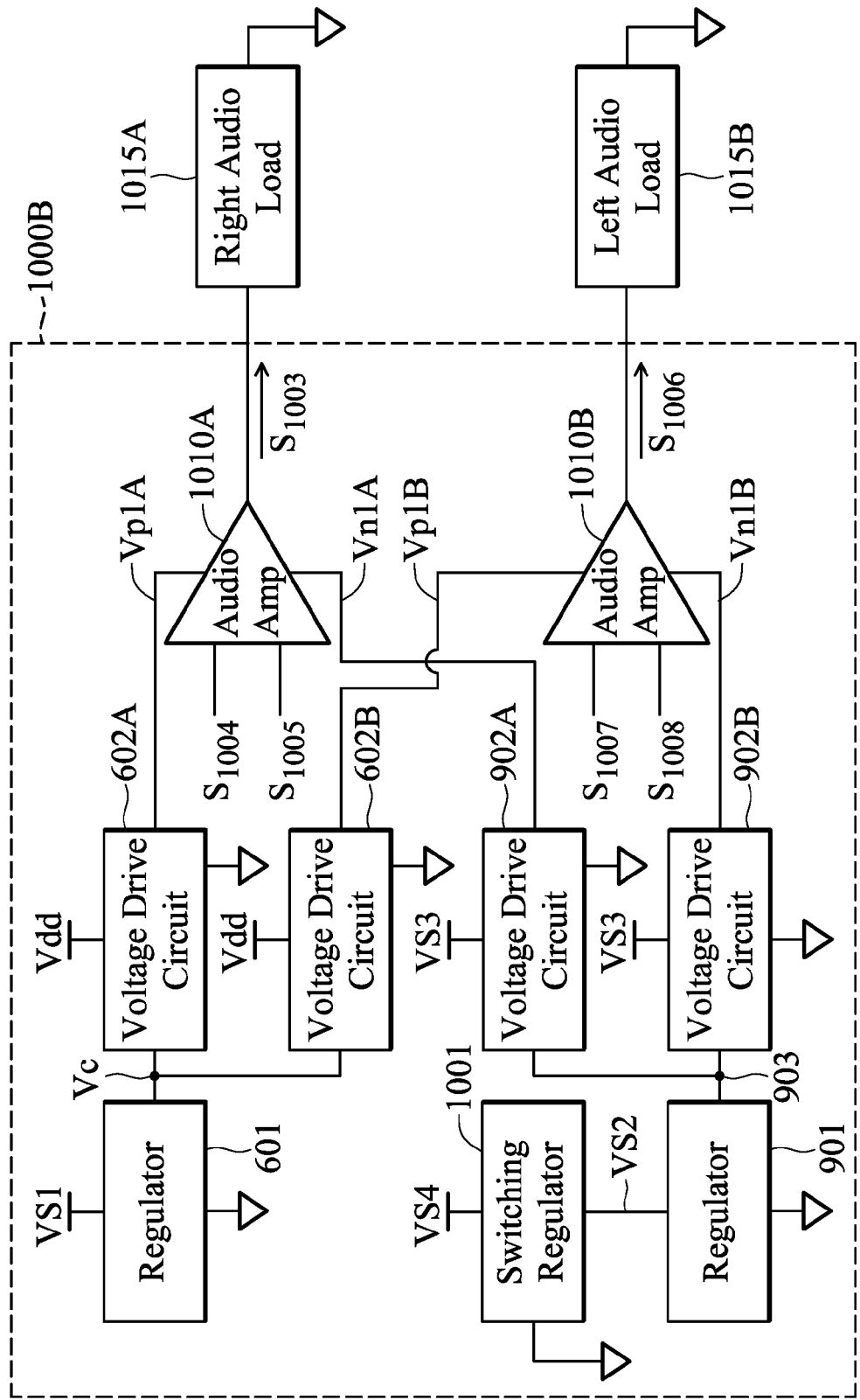
FIG. 10B shows a DC-coupled audio out unit 1000B in a stereo system according to an embodiment of the invention.

FIG. 10B shows a DC-coupled audio out unit 1000B in a stereo system according to another embodiment of the invention. Note that the elements labeled with the same numbers in FIG. 10A perform the same function. As shown, the right and left audio amplifiers 1010A and 1010B may share the switching regulator 1001 and the regulator 901, and the two voltage drive circuits 902A and 902B are separately designed for the right and left audio. According to the control voltage 903, the voltage drive circuits 902A and 902B generate negative power voltages Vn1A and Vn1B, respectively, for the right and left audio amplifiers 1010A and 1010B. The sharing of the switching regulator 1001 and the regulator 901 reduces considerable circuit size of the audio out unit 1000B. The right audio amplifier 1010A receives the positive power voltage Vp1A and the negative power voltage Vn1A and amplifies input signals $S_{1004}$ and $S_{1005}$ for the right channel to generate a right audio output signal $S_{1003}$ to a right audio load 1015A, and the left audio amplifier 1010B receives the positive power voltage Vp1B and the negative power voltage Vn1B and amplifies input signals $S_{1007}$ and $S_{1008}$ for the left channel to generate a left audio output signal $S_{1006}$ to a left audio load 1015B.

According to the above embodiments of the invention, the audio amplifiers can receive clean positive and negative power voltages Vp1 and Vn1 to generate the audio output signals without interference and noise to the audio loads.

Figure 11:
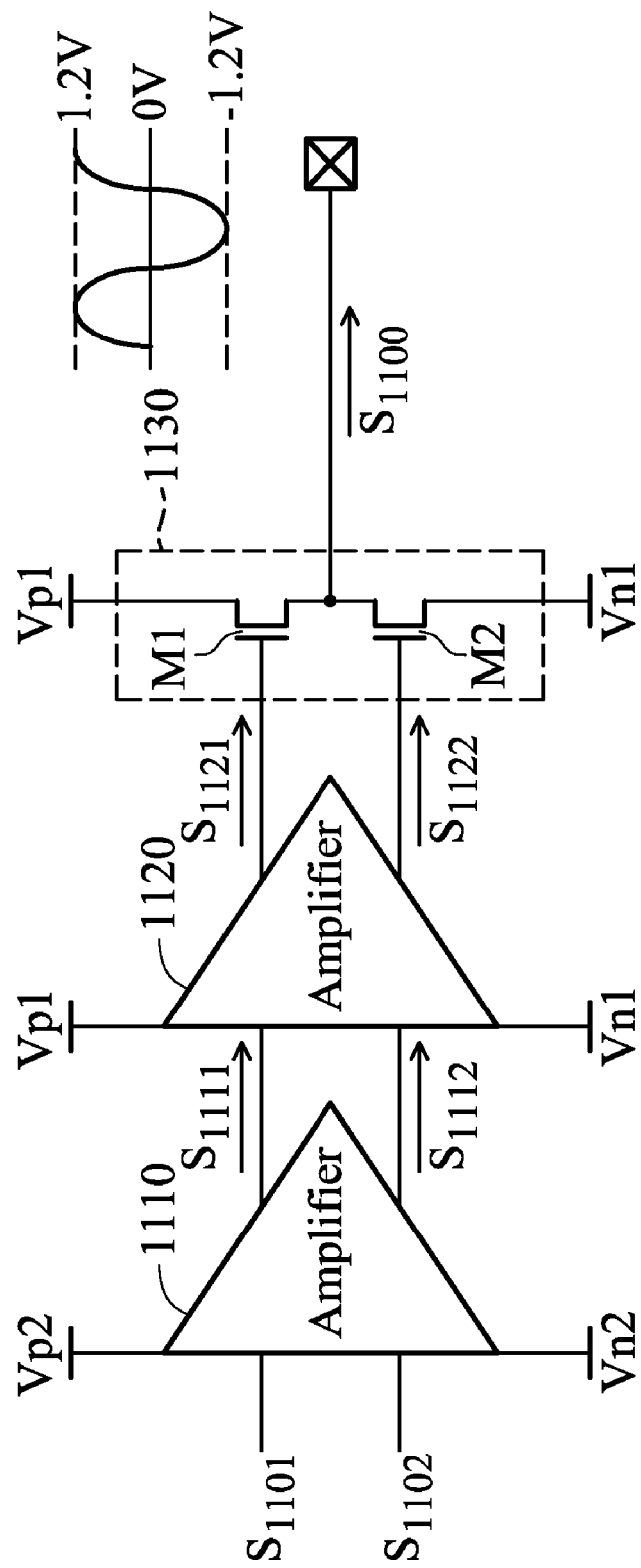
FIG. 11 shows an audio amplifier according to another embodiment of the invention.

FIG. 11 shows an audio amplifier 1100 according to another embodiment of the invention. The audio amplifier 1100 comprises a first-stage amplifier 1110, a second-stage amplifier 1120 and an output driver 1130. The output driver 1130 is composed of a PMOS transistor M1 and an NMOS transistor M2. The first-stage amplifier 1110 receives and amplifies audio signals $S_{1101}$ and $S_{1102}$ (may be $S_{301}$ and $S_{302}$, $S_{401}$ and $S_{402}$, $S_{501}$ and $S_{502}$, $S_{601}$ and $S_{602}$, $S_{801}$ and $S_{802}$, $S_{901}$ and $S_{902}$, or $S_{1001}$ and $S_{1002}$) to generate differential audio signals $S_{1111}$ and $S_{1112}$ to the second-stage amplifier 1120. The second-stage amplifier 1120 receives and amplifies the audio signals $S_{1111}$ and $S_{1112}$ to generate differential audio signal $S_{1121}$ and $S_{1122}$ to the output driver 1130. The output driver 1130 receives the audio signals $S_{1121}$ and $S_{1122}$ to generate the audio output signal $S_{1100}$ (may be $S_{300}$, $S_{400}$, $S_{500}$, $S_{600}$, $S_{800}$ $S_{900}$ or $S_{1000}$) which swings between +1.2V to −1.2V to the audio load.

Figure 12:
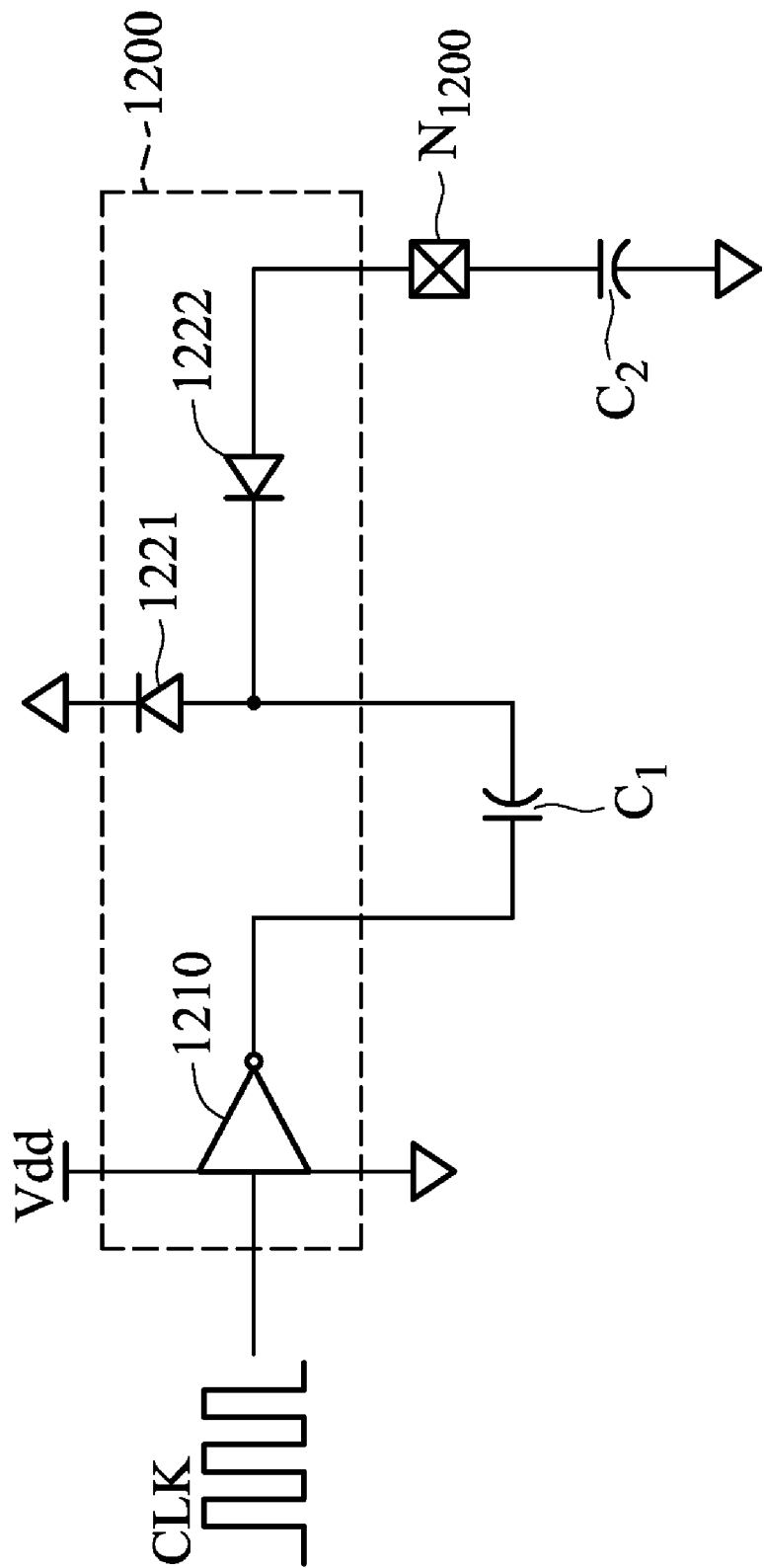
FIG. 12 shows a charge pump circuit according to another embodiment of the invention.

FIG. 12 shows a charge pump circuit 1200 according to another embodiment of the invention. The charge pump circuit 1200 can be used as the aforementioned switching regulator. The charge pump circuit 1200 receives a clock signal CLK, the power source voltage Vdd and the ground voltage GND and generates a negative DC power voltage at a node $N_{1200}$. The charge pump circuit comprises an inverter 1210 and diodes 1221 and 1222, which are connected as shown in FIG. 12. The charge pump circuit 1200 needs to couple to two outside capacitors $C_1$ and $C_2$ to provide negative voltage at the node $N_{1200}$. The capacitor $C_1$ is coupled between the inverter 1210 and the diodes 1221. The diode 1222 is coupled between the capacitor C1 and the capacitor C2, as shown in FIG. 12. The capacitor $C_2$ is coupled between the diode 1222 and the ground. The capacitor $C_1$ and $C_2$ are small capacitors, such as 2.2 uF capacitors. Thus, the capacitors $C_1$ and $C_2$ do not occupy too much circuit area.

While the invention has been described by way of example and in terms of preferred embodiment, it is to be understood that the invention is not limited to thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A DC-coupled audio out unit, comprising:
   a first regulator for receiving a power source voltage to provide a positive power voltage;
   a third regulator for receiving the power source voltage to provide an intermediate voltage; and
   a second regulator for receiving the intermediate voltage to provide a negative power voltage; and
   at least one audio amplifier for receiving the positive power voltage and the negative power voltage, and amplifying at least one input signal to generate an audio output signal to an audio load.

2. The DC-coupled audio out unit as claimed in claim 1, wherein the absolute values of the positive power voltage and the negative power voltage are different.

3. The DC-coupled audio out unit as claimed in claim 1, wherein the third regulator is a switching regulator.

4. The DC-coupled audio out unit as claimed in claim 1, wherein the DC-coupled audio out unit is a stereo system comprising two of the audio amplifier each for generating one of stereo audio output signals.

5. The DC-coupled audio out unit as claimed in claim 1, wherein each of the first and second regulators is arranged to reduce noise and ripples of the power source voltage to provide the corresponding power voltage.

6. A DC-coupled audio out unit, comprising:
   a first regulator for receiving a first supplied voltage to provide a control voltage;
   at least one voltage drive circuit, supplied by a power source voltage, arranged to generate a positive power voltage according to the control voltage;
   a second regulator for receiving an intermediate voltage to provide a negative power voltage; and
   at least one audio amplifier for receiving the positive power voltage and the negative power voltage, and amplifying at least one input signal to generate an audio output signal to an audio load.

7. The DC-coupled audio out unit as claimed in claim 6, further comprising:

a switching regulator for receiving a second supplied voltage to provide the intermediate voltage.

8. The DC-coupled audio out unit as claimed in claim 7, wherein the second supplied voltage is the first supplied voltage, the power source voltage or another voltage independent of the first supplied voltage and the power source voltage.

9. The DC-coupled audio out unit as claimed in claim 6, wherein the second regulator is a linear regulator.

10. The DC-coupled audio out unit as claimed in claim 6, wherein the intermediate voltage is the first supplied voltage or the power source voltage.

11. The DC-coupled audio out unit as claimed in claim 6, wherein the DC-coupled audio out unit is a stereo system comprising two of the audio amplifier each for generating one of stereo audio output signals.

12. A DC-coupled audio out unit, comprising:
- a first regulator for receiving a first supplied voltage to provide a first control voltage;
- at least one first voltage drive circuit, supplied by a power source voltage, arranged to generate a positive power voltage according to the first control voltage;
- a second regulator for receiving an second supplied voltage to provide a second control voltage;
- at least one second voltage drive circuit, supplied by a third supplied voltage, arranged to generate a negative power voltage according to the second control voltage; and
- at least one audio amplifier for receiving the positive power voltage and the negative power voltage, and amplifying at least one input signal to generate an audio output signal to an audio load.

13. The DC-coupled audio out unit as claimed in claim 12, further comprising:
- a switching regulator for receiving a fourth supplied voltage to provide the second supplied voltage.

14. The DC-coupled audio out unit as claimed in claim 13, wherein the first supplied voltage is the power source voltage or another voltage independent of the power source voltage, the third supplied voltage is the fourth supplied voltage or another voltage independent of the fourth supplied voltage, and the fourth supplied voltage is the first supplied voltage, the power source voltage or another voltage.

15. The DC-coupled audio out unit as claimed in claim 12, wherein the second regulator is a linear regulator.

16. The DC-coupled audio out unit as claimed in claim 12, wherein the second supplied voltage is the first supplied voltage or the power source.

17. The DC-coupled audio out unit as claimed in claim 12, wherein the DC-coupled audio out unit is a stereo system comprising two of the audio amplifier each for generating one of stereo audio output signals.

* * * * *